(12) United States Patent
Chang et al.

(10) Patent No.: US 10,431,552 B2
(45) Date of Patent: Oct. 1, 2019

(54) DISPLAY PANEL

(71) Applicant: HannStar Display Corporation, Taipei (TW)

(72) Inventors: Chung-Lin Chang, Kaohsiung (TW); Hsuan-Chen Liu, Kaohsiung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 16/154,739

(22) Filed: Oct. 9, 2018

(65) Prior Publication Data

US 2019/0229066 A1 Jul. 25, 2019

(30) Foreign Application Priority Data

Jan. 23, 2018 (CN) .......................... 2018 1 0062069

(51) Int. Cl.
*H01L 23/544* (2006.01)
*H01L 27/12* (2006.01)

(52) U.S. Cl.
CPC .......... *H01L 23/544* (2013.01); *H01L 27/124* (2013.01); *H01L 27/1218* (2013.01); *H01L 2223/5442* (2013.01); *H01L 2223/54426* (2013.01)

(58) Field of Classification Search
CPC . H01L 23/544; H01L 27/1218; H01L 27/124; H01L 2223/54426
See application file for complete search history.

(56) References Cited

U.S. PATENT DOCUMENTS

| 5,418,613 | A | * | 5/1995 | Matsutani | G03F 9/7076 250/548 |
| 2003/0199131 | A1 | * | 10/2003 | Fujimoto | G03F 9/7076 438/200 |
| 2005/0051909 | A1 | * | 3/2005 | Inonnata | H01L 23/544 257/797 |
| 2009/0121337 | A1 | * | 5/2009 | Abe | H01L 21/67092 257/686 |
| 2009/0310113 | A1 | * | 12/2009 | Musa | G03B 27/54 355/70 |
| 2015/0380358 | A1 | * | 12/2015 | Chang | H01L 23/544 257/797 |
| 2017/0133345 | A1 | * | 5/2017 | Knickerbocker | H01L 24/81 |
| 2019/0206803 | A1 | * | 7/2019 | Kodama | H01L 23/544 |

* cited by examiner

*Primary Examiner* — Allan R Wilson
(74) *Attorney, Agent, or Firm* — CKC & Partners Co., LLC

(57) ABSTRACT

In a display panel, multiple first alignment patterns are disposed in a non-display area on a first substrate, and each first alignment pattern includes a first portion and a second portion connected to each other. Multiple second alignment patterns are disposed in the non-display area on a second substrate, and each of the second alignment patterns includes a third portion and a fourth portion. There is a first length difference between the length of each first portion along a first direction and the length of the corresponding third portion along the first direction, and the first length differences are different from each other. There is a second length difference between the length of each second portion along a second direction and the length of the corresponding fourth portion along the second direction, and the second length differences are different from each other.

20 Claims, 13 Drawing Sheets

DISPLAY PANEL

RELATED APPLICATIONS

This application claims priority to China Application Serial Number 201810062069.5 filed Jan. 23, 2018, which is herein incorporated by reference.

BACKGROUND

Field of Invention

The present invention relates to a display panel. More particularly, the present invention relates to the display panel configured to assist alignment of two substrates.

Description of Related Art

In general, a display panel includes two substrates in which one substrate (also referred to an array substrate) includes a pixel array, and the other one includes a color filter layer, a black matrix layer, etc. After the two substrates are assembled, the alignment between those two substrates has to be verified by some mechanism. In the prior art, alignment patterns are additionally disposed in a non-display area of the display panel to verify the alignment between the two substrates after being assembled. In nowadays, developing narrow border becomes a global trend, but the additional alignment patterns would more or less obstruct the development of narrow border. Therefore, it is an issue in the art about how to address this problem.

SUMMARY

Embodiments of the invention provide a display panel, in which alignment patterns are disposed in peripheral metal routes in the non-display area for observing the shift along X direction and Y direction after two substrates are assembled. Therefore, there is no need to additionally provide space to accommodate alignment patterns and alignment rulers in the display panel.

Embodiments of the invention provide a display panel having a display area and a non-display area. The display panel includes a first substrate and a second substrate. A metal layer is disposed on the first substrate, the metal layer has first alignment patterns in the non-display area, and each of the first alignment patterns includes a first portion and a second portion connected to each other, but they might unconnected as dummy lines. A light shielding layer is disposed on the second substrate, the light shielding layer has second alignment patterns in the non-display area, and each of the second alignment patterns includes a third portion and a fourth portion. The second alignment patterns respectively correspond to the first alignment patterns, and the third portions respectively correspond to the first portions, and the fourth portions respectively correspond to the second portions. There is a first length difference between a length of each of the first portions along a first direction and a length of the corresponding third portion along the first direction, and at least two of the first length differences are different. There is a second length difference between a length of each of the second portions along a second direction and a length of the corresponding fourth portion along the second direction, and at least two of the second length differences are different. The light shielding layer has openings in the non-display area, and one of the openings encompass one of the first alignment patterns and one of the second alignment patterns.

In some embodiments, the first portions belong to a first metal line extending along the second direction. The second portions belong to second metal lines extending along the first direction.

In some embodiments, the third portions extend toward the second direction, and the fourth portions extend toward the first direction.

In some embodiments, each of the first alignment patterns further includes a fifth portion and a sixth portion connected to each other. The fifth portions extend toward the second direction, and the sixth portions extend toward the first direction.

In some embodiments, each of the second alignment patterns further includes a seventh portion and an eighth portion. The seventh portions extend toward the second direction, and the eighth portions extend toward the first direction.

In some embodiments, there is a third length difference between a length of each of the fifth portions along the first direction and a length of the corresponding seventh portion along the first direction, and at least two of the third length differences are different. There is a fourth length difference between a length of each of the sixth portions along the second direction and a length of the corresponding eighth portion along the second direction, and at least two of the fourth length differences are different.

In some embodiments, at least two of the first alignment patterns are electrically connected to each other.

In some embodiments, the light shielding layer includes a border portion disposed in the non-display area. There is a gap between each of the second alignment patterns and the border portion.

In some embodiments, the metal layer is a first metal layer, and a second metal layer is disposed on the first substrate. The second metal layer includes third alignment patterns which are disposed in the non-display area and respectively correspond to the first alignment patterns.

In some embodiments, each of the third alignment patterns is partially overlapped with one of the first alignment patterns.

In some embodiments, each of the third alignment patterns includes a first segment and a second segment. The first segment extends toward the second direction, and the second segment extends toward the first direction.

In some embodiments, at least two of the lengths of the first segments along the first direction are different, and at least two of the lengths of the second segments along the second direction are different.

In some embodiments, one of the first segments is at least partially overlapped with one of the first portions. One of the second segments is at least partially overlapped with one of the second portions.

In some embodiments, each of the third alignment patterns further includes a third segment and a fourth segment. The third segments extend toward a direction opposite to the second direction. The fourth segments extend toward a direction opposite to the first direction.

In some embodiments, at least two of the lengths of the first portions along the first direction are different, and two of the lengths of the second portions along the second direction are different.

In some embodiments, at least two of the lengths of the third portions along the first direction are different, and at least two of the lengths of the fourth portions along the second direction are different.

In some embodiments, the metal layer includes first metal lines and second metal lines. At least part of the first metal lines is intersected with at least part of the second metal lines. Different ones of the first alignment patterns are located at intersections of different ones of the first metal lines and different ones of the second metal lines.

In some embodiments, the third portion and the fourth portion of each of the second alignment patterns are connected to each other.

In some embodiments, there is a gap between the third portion and the fourth portion of each of the second alignment patterns.

In some embodiments, the length of the third portion of one of the second alignment patterns along the first direction is longer than a length of the first portion of the corresponding first alignment pattern along the first direction. The length of the fourth portion of one of the second alignment patterns along the second direction is longer than a length of the second portion of the corresponding first alignment pattern along the second portion.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology but are not referred to particular order or sequence.

Figure 1:
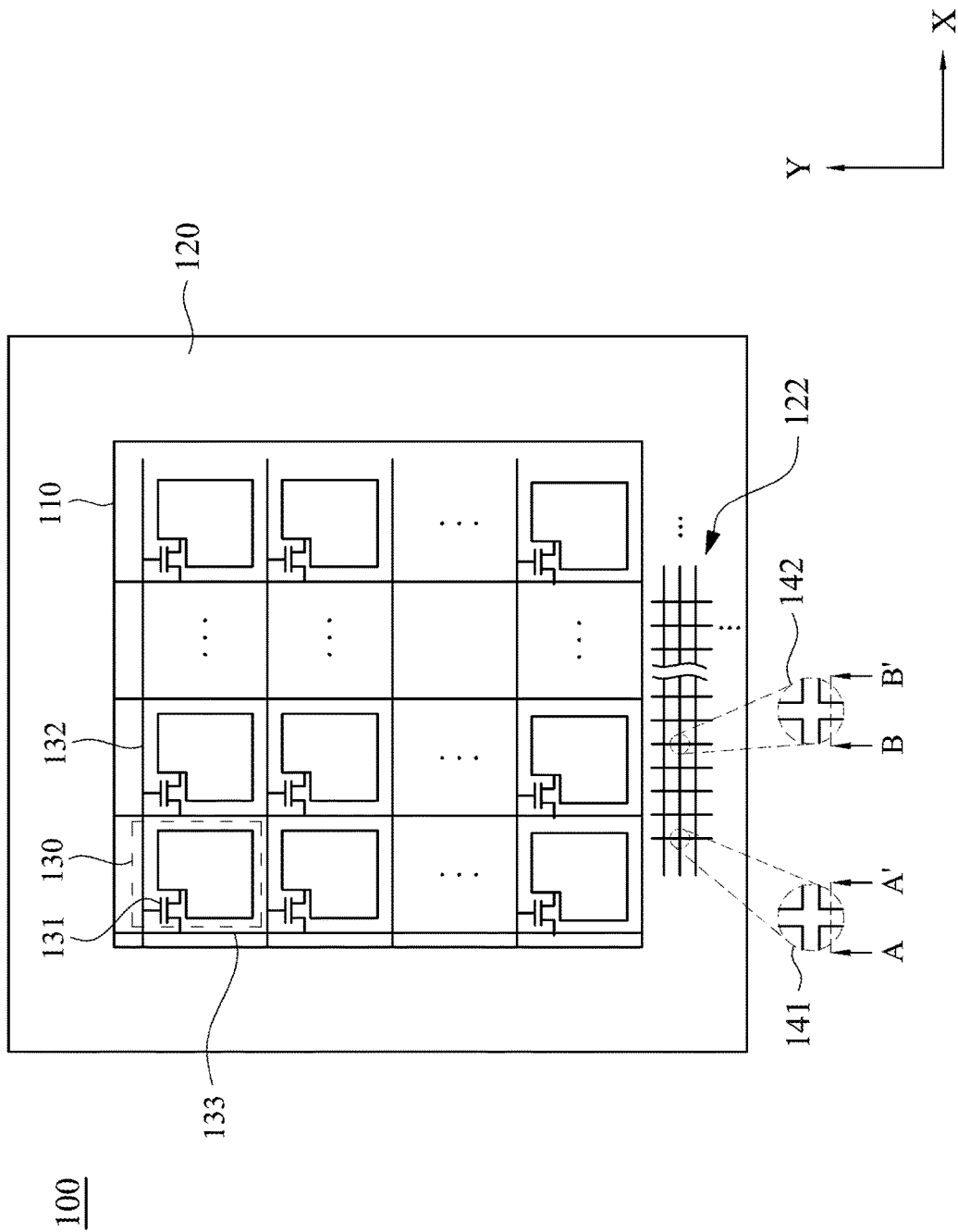
FIG. 1 is a schematic diagram illustrating a top view of a display panel in accordance with an embodiment.

FIG. 1 is a schematic diagram illustrating a top view of a display panel in accordance with an embodiment. Referring to FIG. 1, a display panel 100 has a display area 110 and a non-display area 120. Pixels, scan lines, and data lines are disposed in the display area 110. For example, a pixel 130 includes a thin film transistor 131 which has a gate connected to the scan line 132, and a source connected to a data line 133. However, FIG. 1 is merely an example for explanation, and the number, structures, and locations of the pixels in the display area 110 are not limited thereto, and the shape of the display area 110 is not limited thereto.

A metal route 122 with a mesh shape is disposed in the non-display area 120. In some embodiments, the metal route 122 may be connected to any wire (e.g. scan line, data line, or touch sensing line) in the display area 110. In a process of assembling the two substrates, optical glue is used in the border, and light is required to cure the optical glue. The mesh shape facilitates the light to pass through. In some situations that resistances of the routes have to be matched, the mesh-shape metal route is configured to meet the requirement of resistance matching for a driver circuit with special specification. The metal route 122 is disposed at the bottom of the display area 110 in the embodiment of FIG. 1, but it may be disposed at the top, left, right, or any other side of the display area 110. The metal route 122 may be a dummy route which is formed by a same process as that of the lines in the display area 110. Alternatively, the metal route 122 may be connected to a driver circuit disposed in the non-display area 120 that may be a gate driver, a source driver or any other suitable circuit. In some embodiments, the driver circuit may be disposed on a flexible circuit board such as Tape Carrier Package (TCP) or Chip on Film (COF), or the driver circuit may be disposed on the array substrate. In addition, the driver circuit may be a Touch and Display Driver Integration (TDDI) single chip providing display and touch functions. In some embodiments, the driver circuit may include multiple chips respectively providing the display and the touch functions. In some embodiments, the driver circuit may have form of Gate-Driver In Plane (GIP), or an Integrated Gate Driver (IGD). In addition, the number of the driver circuit may be more than one and are disposed at upper and lower sides of the panel, or disposed at left and right sides of the panel, or disposed at the same side of the panel.

Figure 2A:
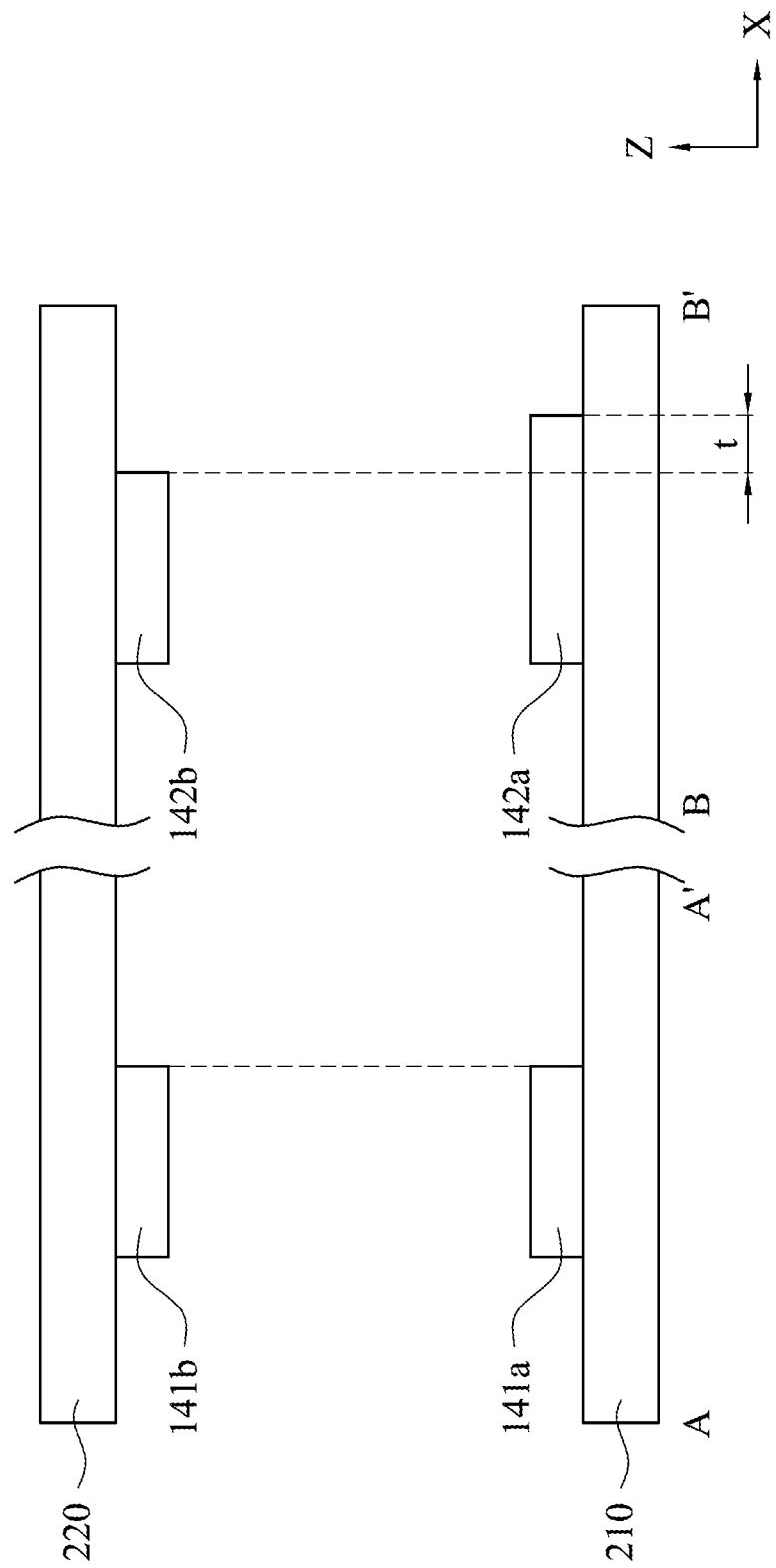
FIG. 2A and FIG. 2B are schematic diagrams illustrating the determination of shifts between two substrates by alignment patterns in accordance with some embodiments.
Figure 2B:
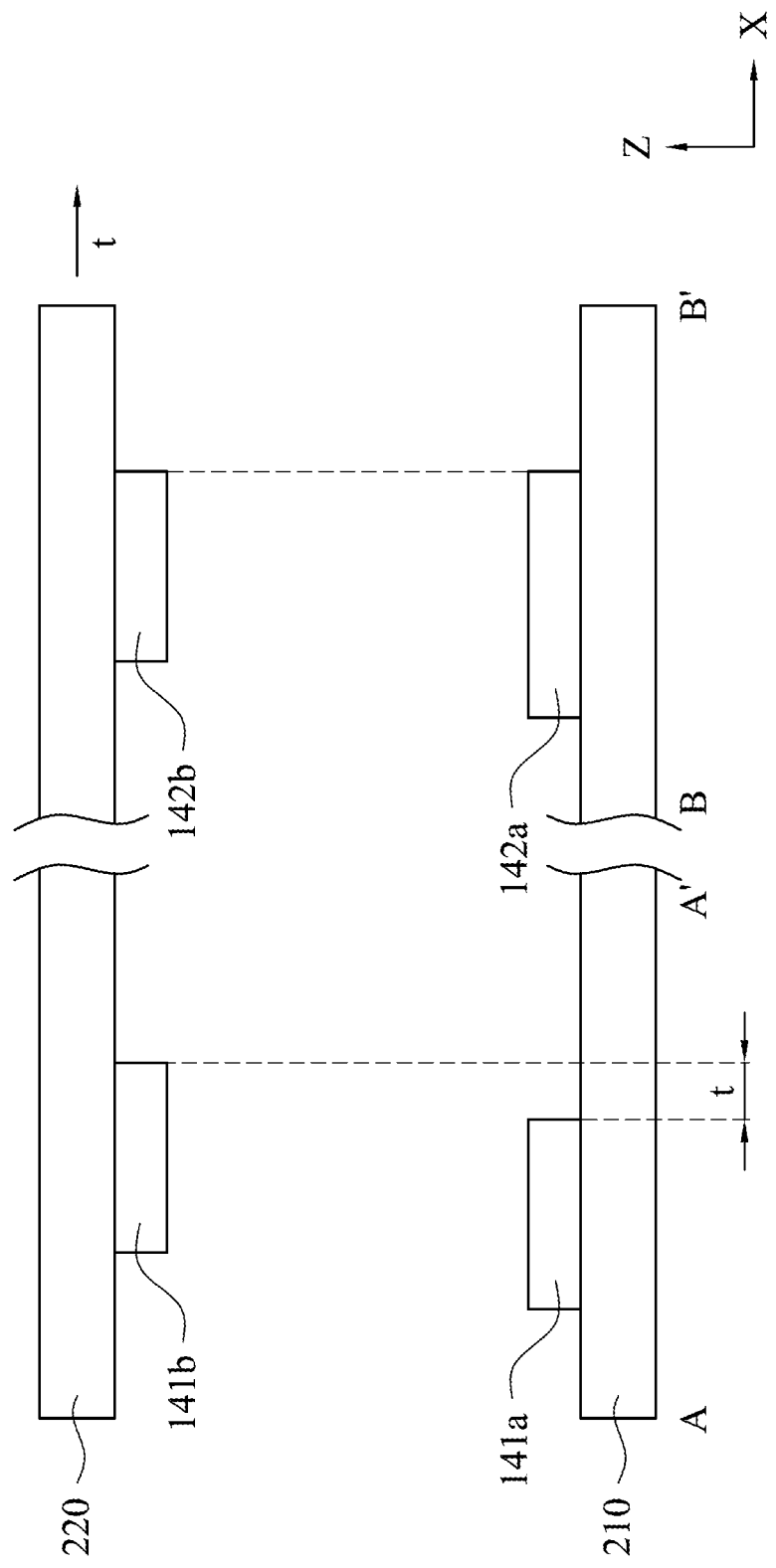

Multiple alignment patterns (e.g. alignment patterns 141 and 142) are disposed at intersections of horizontal metal lines and vertical metal lines in the metal route 122. These alignment patterns are disposed between two opposite substrates of the display panel 100 for observing the shift between the two substrates (only overlapped alignment patterns are seen because FIG. 1 shows the top view). For example, FIG. 2A and FIG. 2B are schematic diagrams illustrating the determination of the shift between the substrates by checking alignment patterns in accordance with some embodiments. Referring to FIG. 2A, alignment patterns 141a, 142 are disposed on a substrate 210, and alignment patterns 141b, 142b are disposed on a substrate 220, and these alignment patterns may be formed by metal or other opaque material. The length of the alignment pattern 142a along an X direction is longer than the length of the alignment pattern 141a along the X direction. There is no shift between the substrate 210 and the substrate 220 in FIG. 2A, and in this case, the right edge of the alignment pattern 141b is aligned with the right edge of the alignment pattern 141a; and the right edge of the alignment pattern 142b is not aligned with the right edge of the alignment pattern 142a in which they are spaced from each other by a distance t. In FIG. 2B, the substrate 220 is shifted toward the X direction in distance t, and in this case, the right edge of the alignment pattern 141b is not aligned with the right edge of the alignment pattern 141a, and they are spaced from each other by the distance t; and the right edge of the alignment pattern 142b is aligned with the right edge of the alignment pattern 142a. Therefore, if the situation of FIG. 2B is observed, it can be determined that the substrate 220 is shifted toward X direction in the distance t relative to the substrate 210. In other words, the shift along the X or Y direction can be determined by observing which set of alignment patterns are aligned because the locations and lengths of these alignment patterns are known. In particular, both of the shifts along X and Y directions can be detected by the alignment patterns provided in the embodiments below.

The material of the substrate 210 and/or the substrate 220 may include glass, polymer, polyethylene terephthalate (PET), polycarbonate (PC), polyether sulfone (PES), triacetyl cellulose (TAC), PMMA, polyethylene, COP, polyimide (PI), and a compound material constituted by PC and PMMA, which is not limited in the invention. In addition, the substrate 210 may be referred to a lower substrate or the array substrate, and the substrate 220 may be referred to an upper substrate or color filter (CF) substrate.

Figure 3:
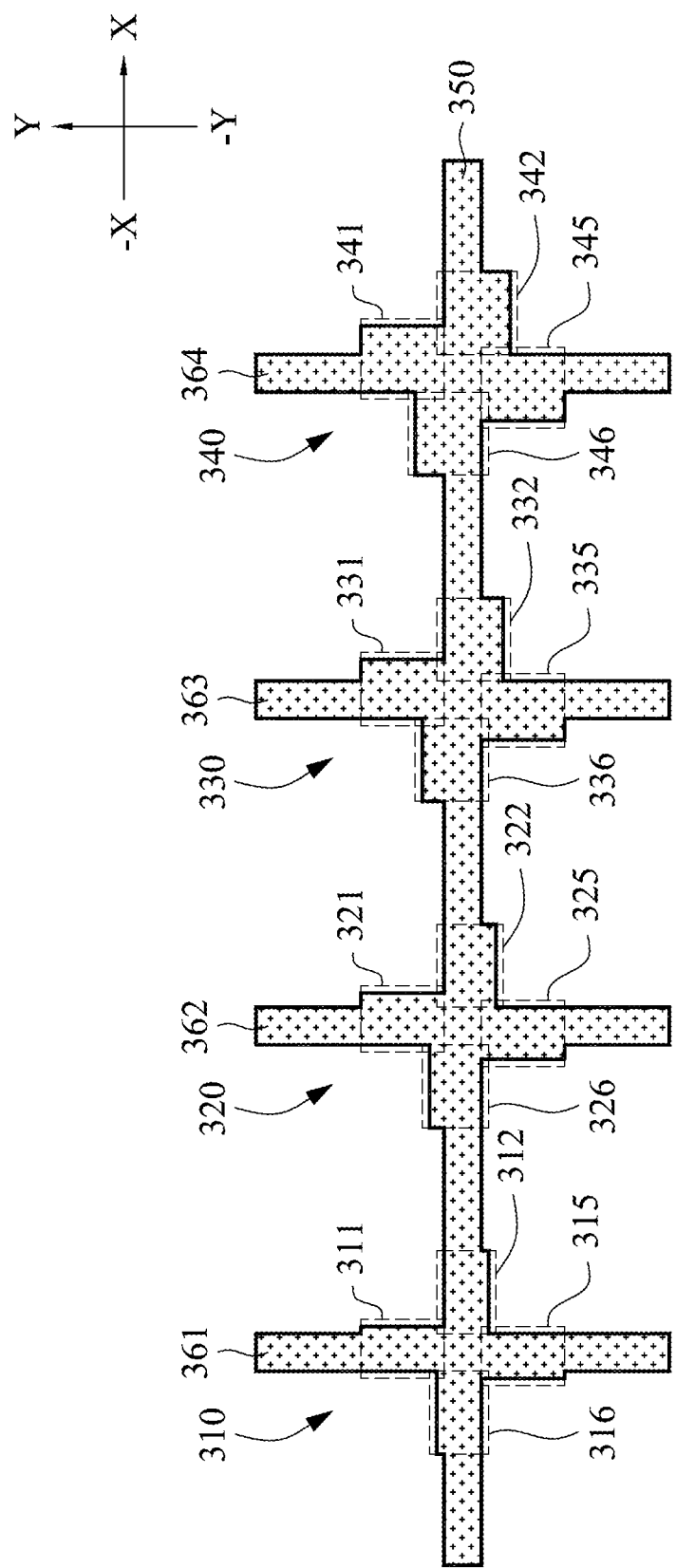
FIG. 3 is a schematic diagram illustrating a top view of alignment patterns on a first substrate in accordance with an embodiment.

FIG. 3 is a schematic diagram illustrating a top view of alignment patterns on a first substrate in accordance with an embodiment. Referring to FIG. 3, alignment patterns 310, 320, 330 and 340 (also referred to first alignment patterns) are disposed in the non-display area on the substrate 210. These alignment patterns are formed by a metal layer and are located in the mesh-shape metal route. The metal layer is, for example, a first metal layer. Each of the alignment patterns 310, 320, 330 and 340 has four portions connected to each other. In detail, the alignment pattern 310 includes a first portion 311, a second portion 312, a fifth portion 315, and a sixth portion 316 connected to each other; the alignment pattern 320 includes a first portion 321, a second portion 322, a fifth portion 325, and a sixth portion 326 connected to each other; the alignment pattern 330 includes a first portion 331, a second portion 332, a fifth portion 335, and a sixth portion 336 connected to each other; the alignment pattern 340 includes a first portion 341, a second portion 342, a fifth portion 345, and a sixth portion 346 connected to each other. The first portions 311, 321, 331, and 341 extend toward Y direction, but their lengths along X direction are different and increase toward X direction. The second portions 312, 322, 332, and 342 extend toward X direction, but their lengths along Y direction are different and increase toward −Y direction. The fifth portions 315, 325, 335, and 345 extend toward −Y direction, but their lengths along X direction are different and extend toward −X direction. The sixth portions 316, 326, 336, and 346 extend toward −X direction, but their lengths along Y direction are different and increase toward Y direction.

The alignment patterns 310, 320, 330, and 340 are electrically connected to each other through a metal line 350 in which the second portions 312, 322, 332, 342 and the sixth portions 316, 326, 336 and 346 are disposed on the metal line 350. In addition, the first portion 311 and the fifth portion 315 are disposed on a metal line 361; the first portion 321 and the fifth portion 325 are disposed on a metal line 362; the first portion 331 and the fifth portion 335 are disposed on a metal line 363; and the first portion 341 and the fifth portion 345 are disposed on a metal line 364. The metal line 350 is connected to the metal lines 361, 362, 363 and 364.

Figure 4:
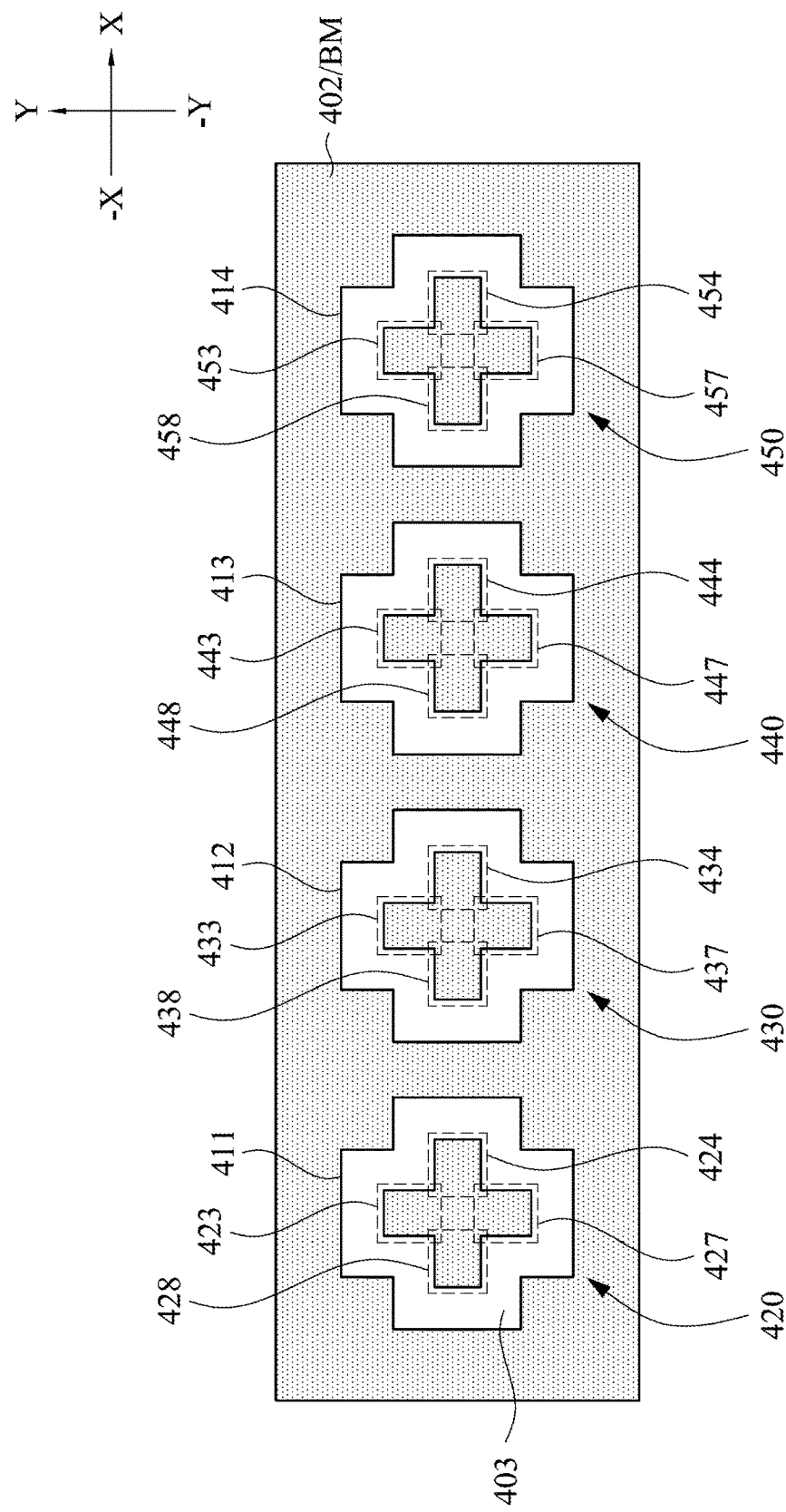
FIG. 4 is a schematic diagram illustrating a top view of alignment patterns on a second substrate in accordance with an embodiment.

FIG. 4 is a schematic diagram illustrating a top view of alignment patterns on a second substrate in accordance with an embodiment. Referring to FIG. 4, a light shielding layer BM is disposed on the substrate 220 (not shown in FIG. 4). In the display area, the light shielding layer BM is used to cover the scan lines, data lines, etc. The light shielding layer BM is, for example, a black matrix or other opaque material. The light shielding layer BM includes a border portion 402 in the non-display area. The border portion 402 includes alignment patterns 420, 430, 440, and 450 (also referred to as second alignment patterns), and they have openings 411, 412, 413 and 414 respectively. Each of the alignment patterns 420, 430, 440, and 450 is spaced from the border portion 402 by a gap (e.g. gap 403) in the area encompassed by the corresponding one of the openings 411, 412, 413 and 414. The alignment pattern 420 includes a third portion 423, a fourth portion 424, a seventh portion 427, and an eighth portion 428. The alignment pattern 430 includes a third portion 433, a fourth portion 434, a seventh portion 437, and an eighth portion 438. The alignment pattern 440 includes a third portion 443, a fourth portion 444, a seventh portion 447, and an eighth portion 448. The alignment pattern 450 includes a third portion 453, a fourth portion 454, a seventh portion 457, and an eighth portion 458.

In the embodiment of FIG. 4, the third portions 423, 433, 443, and 453 extend toward Y direction, and their lengths along X direction are the same. The fourth portions 424, 434, 444, and 454 extend toward X direction, and their lengths along Y direction are the same. The seventh portions 427, 437, 447, and 457 extend toward −Y direction, and their lengths along X direction are the same. The eighth portions 428, 438, 448, and 458 extend toward −X direction, and their lengths along Y direction are the same.

Figure 5A:
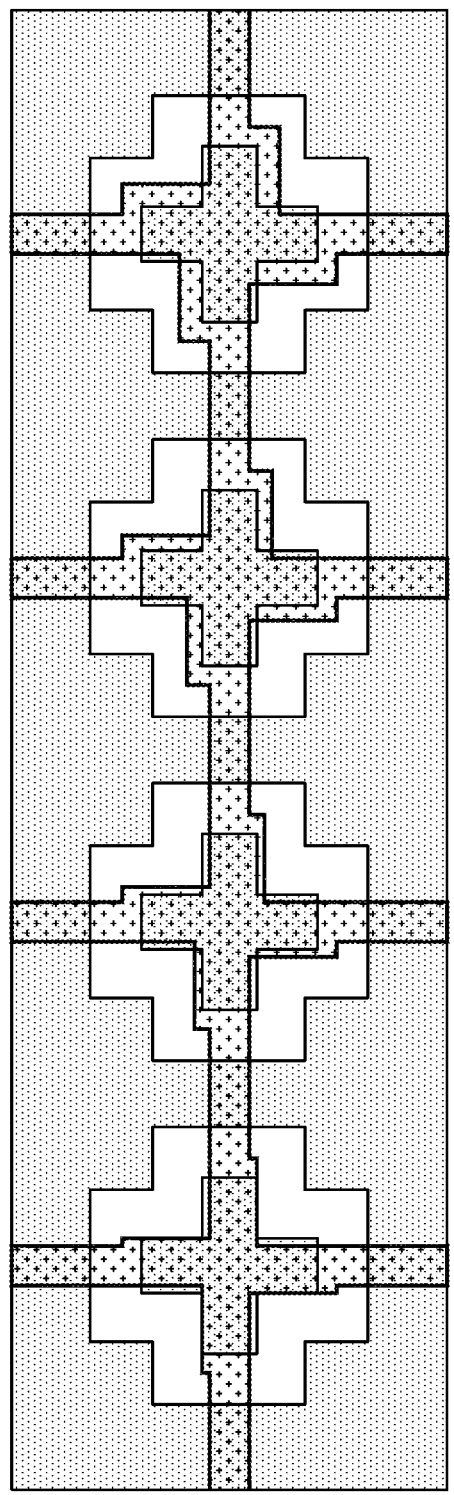
FIG. 5A and FIG. 5B are schematic diagrams illustrating top views of the two substrates after being assembled in accordance with some embodiments.

Referring to FIG. 3 and FIG. 4, the alignment patterns 310, 320, 330, and 340 correspond to the alignment patterns 420, 430, 440, and 450 respectively. In detail, the third portions 423, 433, 443, and 453 correspond to the first portions 311, 321, 331, and 341 respectively. The fourth portions 424, 434, 444, and 454 correspond to the second portions 312, 322, 332, and 342 respectively. The seventh portions 427, 437, 447, and 457 correspond to the fifth portions 315, 325, 335, and 345 respectively. The eighth portions 428, 438, 448, and 458 correspond to the sixth portions 316, 326, 336, and 346 respectively. The shift between the two substrates can be determined by observing which set of alignment patterns are aligned with each other because the lengths of the alignment patterns 310, 320, 330, and 340 gradually change along X direction or Y direction. To be specific, FIG. 5A is a schematic diagram illustrating a top view of the two substrates after being assembled in accordance with an embodiment. Referring to FIG. 3, FIG. 4 and FIG. 5A, the reference of each portion is not shown in FIG. 5A for clarity, and these references may be referred to FIG. 3 and FIG. 4. Openings 411, 412, 413 and 414 of the light shielding layer BM encompass the alignment pattern 310, 320, 330, and 340 respectively. Referring to FIG. 5A, there is a first length difference between the length of each of the first portions 311, 321, 331, 341 and that of the corresponding one of the third portions 423, 433, 443 and 453 along X direction, and these first length differences are different from each other. For example, the length difference between the length of the first portion 311 and that of the third portion 423 along X direction is relatively smaller; and the length difference between the length of the first portion 341 and that of the third portion 453 along X direction is relatively larger, and so on. On the other hand, there is a second length difference between the length of each of the second portions 312, 322, 332 and 342 and that of the corresponding one of the fourth portions 424, 434, 444 and 454 along Y direction, and these second length differences are different from each other. For example, the length difference between the length of the second portion 312 and that of the fourth portion 424 along Y direction is relatively smaller; and the length difference between the length of the second portion 342 and that of the fourth portion 454 along Y direction is relatively larger. There is a third length difference between the length of each of the fifth portions 315, 325, 335 and 345 and that of the corresponding one of the seventh portions 427, 437, 447 and 457 along X direction, and these third length differences are different from each other. For example, the length difference between the length of the fifth portion 315 and that of the seventh portion 427 along X direction is relatively smaller; and the length difference between the length of the fifth portion 345 and that of the seventh portion 457 along X direction is relatively larger. There is a fourth length difference between the length of each of the sixth portions 316, 326, 336 and 346 and that of the corresponding one of the eighth portions 428, 438, 448 and 458 along Y direction, and these fourth length differences are different from each other. For example, the length difference between the length of the sixth portion 316 and that of the eighth portion 428 along Y direction is relatively smaller; and the length difference between the length of the sixth portion 346 and that of the eighth portion 458 along X direction is relatively larger.

Figure 5B:
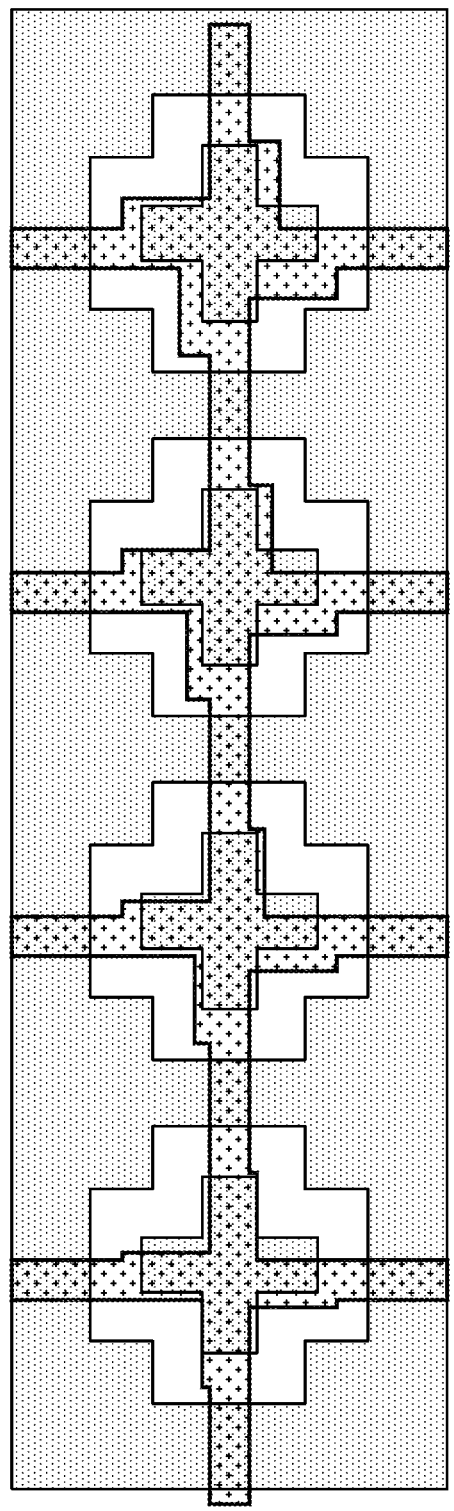

The shift toward X direction can be determined by observing which first portion is aligned with the corresponding third portion; the shift toward –X direction can be determined by observing which fifth portion is aligned with the corresponding seventh portion; the shift toward Y direction can be determined by observing which sixth portion is aligned with the corresponding eighth portion; the shift toward –Y direction can be determined by observing which second portion is aligned with the corresponding fourth portion. In the embodiment of FIG. 5A, referring to the assembling of the alignment pattern 310 and the alignment pattern 420: the right edge of the first portion 311 is vertically aligned with the right edge of the third portion 423; the bottom edge of the second portion 312 is horizontally aligned with the bottom edge of the fourth portion 424; the left edge of the fifth portion 315 is vertically aligned with the left edge of the seventh portion; the top edge of the sixth portion 316 is horizontally aligned with the top edge of the eighth portion 428. Therefore, it can be determined that there is no shift between the two substrates. FIG. 5B is a schematic diagram illustrating the top view of the two substrates after being assembled in accordance with an embodiment. Referring to FIG. 3, FIG. 4, and FIG. 5B, and the reference of each portion is not shown in FIG. 5B for clarity. In the embodiment of FIG. 5B, the right edge of the first portion 331 is vertically aligned with the right edge of the third portion 443; the bottom edge of the second portion 312 is horizontally aligned with the bottom edge of the fourth portion 424; the top edge of the sixth portion 316 is horizontally aligned with the top edge of the eighth portion 428. Therefore, it is determined that the substrate 220 is shifted toward X direction relative to substrate 210, and there is not shift toward Y direction. In more detail, if the lengths of the first portions 311, 321, 331, and 341 along X direction gradually increase by an distance t, then the substrate 220 is shift toward X direction in the distance 2t relative to the substrate 210 in the embodiment of FIG. 5B. Similarly, the shift toward –X direction, Y direction, and –Y direction can be determined by this approach, and they will not be described in detail.

Figure 6:
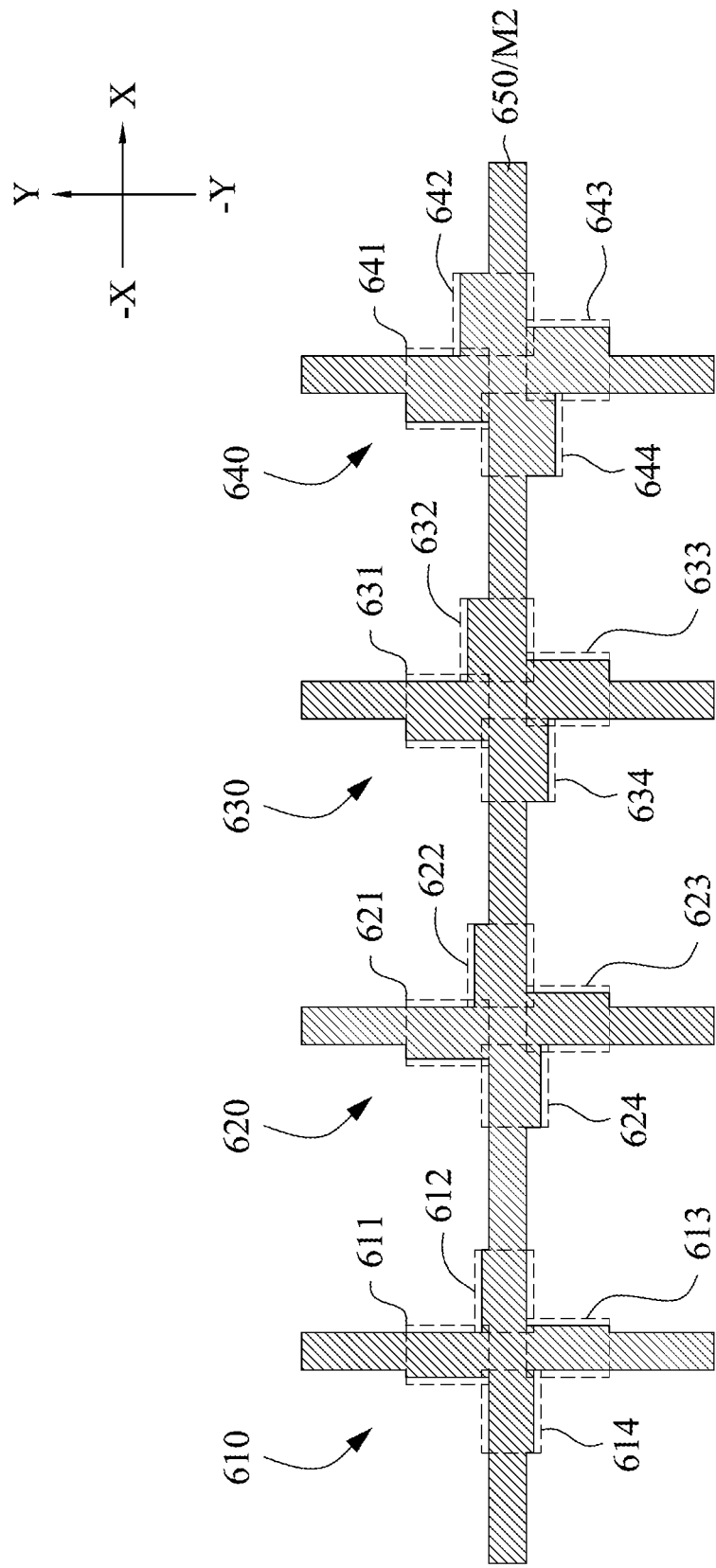
FIG. 6 is a schematic diagram illustrating a top view of the alignment patterns in the second metal layer in accordance with an embodiment.

In some embodiments, the metal layer shown in FIG. 3 is the first metal layer, and a second metal layer is also disposed on the substrate 210 in which the first metal layer is disposed between the substrate 210 and the second metal layer. FIG. 6 is a schematic diagram illustrating a top view of the alignment patterns in the second metal layer in accordance with an embodiment. Referring to FIG. 6, the second metal layer M2 includes alignment patterns 610, 620, 630, and 640, and each of the alignment patterns includes multiple portions connected to each other. In detail, the alignment pattern 610 includes portions 611, 612, 613 and 614 connected to each other; the alignment pattern 620 includes portions 621, 622, 623, and 624 connected to each other; the alignment pattern 630 includes portions 631, 632, 633 and 634 connected to each other; and the alignment pattern 640 includes portions 641, 642, 643 and 644 connected to each other. The portions 611, 621, 631, and 641 extend toward Y direction, and their lengths along X direction are different and gradually increase toward –X direction. The portions 612, 622, 632, and 642 extend toward X direction, and their lengths along Y direction are different and gradually increase toward Y direction. The portions 613, 623, 633, and 643 extend toward –Y direction, and their lengths along X direction are different and gradually increase toward X direction. The portions 614, 624, 634, and 644 extend toward –X direction, and their lengths along Y direction are different and gradually increase toward –Y direction.

Figure 7:
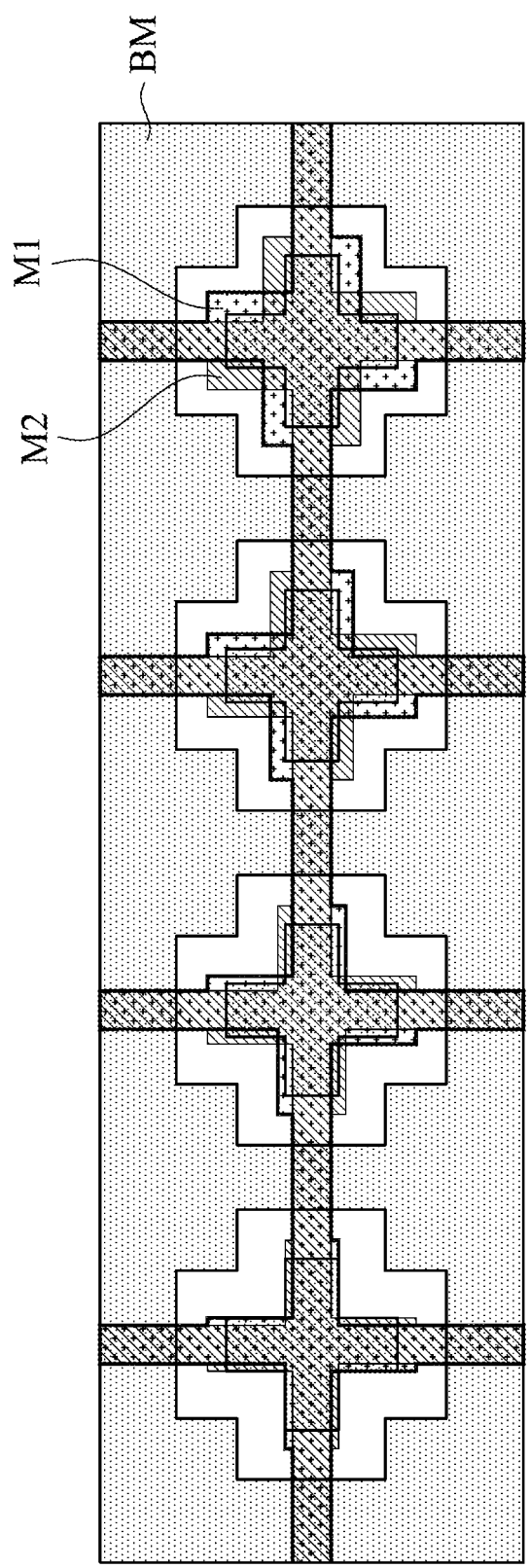
FIG. 7 is a schematic diagram illustrating a top view of the two substrates after being assembled in accordance with an embodiment.

FIG. 7 is a schematic diagram illustrating a top view of the two substrates after being assembled in accordance with an embodiment. The first metal layer M1, the second metal layer M2, and the light shielding layer BM are shown in the embodiment of FIG. 7. Referring to FIG. 6 and FIG. 7, the shift between the two substrates can be determined in accordance with the alignment between the alignment patterns 610, 620, 630, and 640 in the second metal layer M2 and the alignment patterns 420, 430, 440 and 450 in the light shielding layer BM. However, the determination is similar to that with respect to the first metal layer M1, and therefore it will not be repeated.

Figure 8:
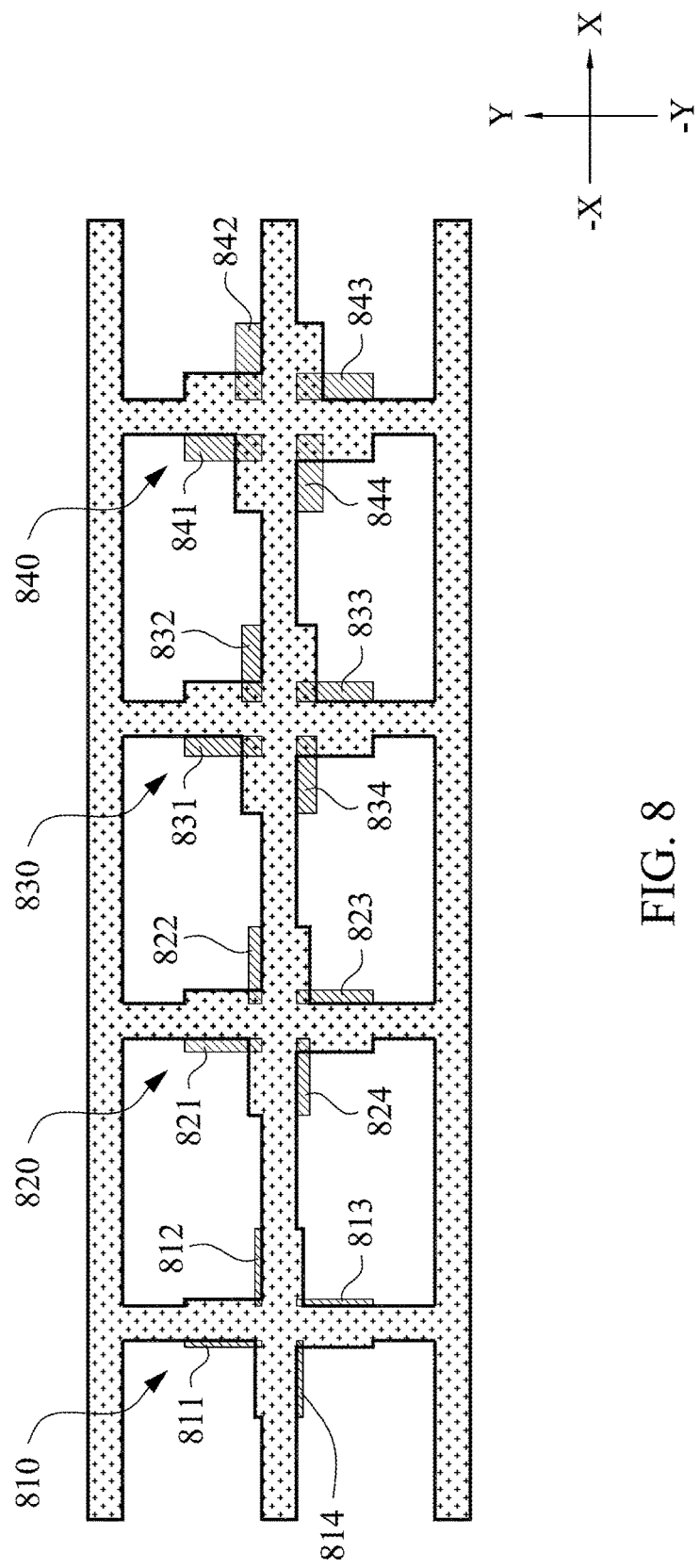
FIG. 8 is a schematic diagram illustrating a top view of the alignment patterns in the first metal layer and the second metal layer.

In the embodiment of FIG. 6, the four portions of each alignment pattern 610, 620, 630 and 640 are connected to each other, but each alignment pattern may include segments separated from each other in other embodiments. FIG. 8 is a schematic diagram illustrating a top view of the alignment patterns in the first metal layer and the second metal layer. Referring to FIG. 3 and FIG. 8, the reference of the alignment patterns in the first metal layer are not shown in FIG. 8 for clarity. The second metal layer M2 includes alignment patterns 810, 820, 830, and 840 (also referred to third alignment patterns) which correspond to the alignment patterns 310, 320, 330, and 340 in the first metal layer M1 respectively. The alignment pattern 810 includes a first segment 811, a second segment 812, a third segment 813, and a fourth segment 814. The alignment pattern 820 includes a first segment 821, a second segment 822, a third segment 823, and a fourth segment 824. The alignment pattern 830 includes a first segment 831, a second segment 832, a third segment 833, and a fourth segment 834. The alignment pattern 840 includes a first segment 841, a second segment 842, a third segment 843, and a fourth segment 844. The first segments 811, 821, 831 and 841 extend toward Y direction, and their lengths along X direction are different and gradually increase toward −X direction. The second segment 812, 822, 832 and 842 extend toward X direction, and their lengths along Y direction are different and gradually increase toward Y direction. The third segments 813, 823, 833 and 843 extend toward −Y direction, and their lengths along X direction are different and gradually increase toward X direction. The fourth segments 814, 824, 834 and 844 extend toward −X direction, and their lengths along Y direction are different and gradually increase toward −Y direction.

Each of the alignment patterns 810, 820, 830, and 840 is partially overlapped with the corresponding one of the alignment patterns 310, 320, 330, and 340. In detail, the first segments 811, 821, 831, and 841 are overlapped with the first portions 311, 321, 331, and 341 respectively; the second segments 812, 822, 832, and 842 are overlapped with the second portions 312, 322, 332, and 342 respectively; the third segments 813, 823, 833, and 843 are overlapped with the fifth portions 315, 325, 335, and 345 respectively; and the fourth segments 814, 824, 834, and 844 are overlapped with the first portions 316, 326, 336, and 346 respectively.

Figure 9:
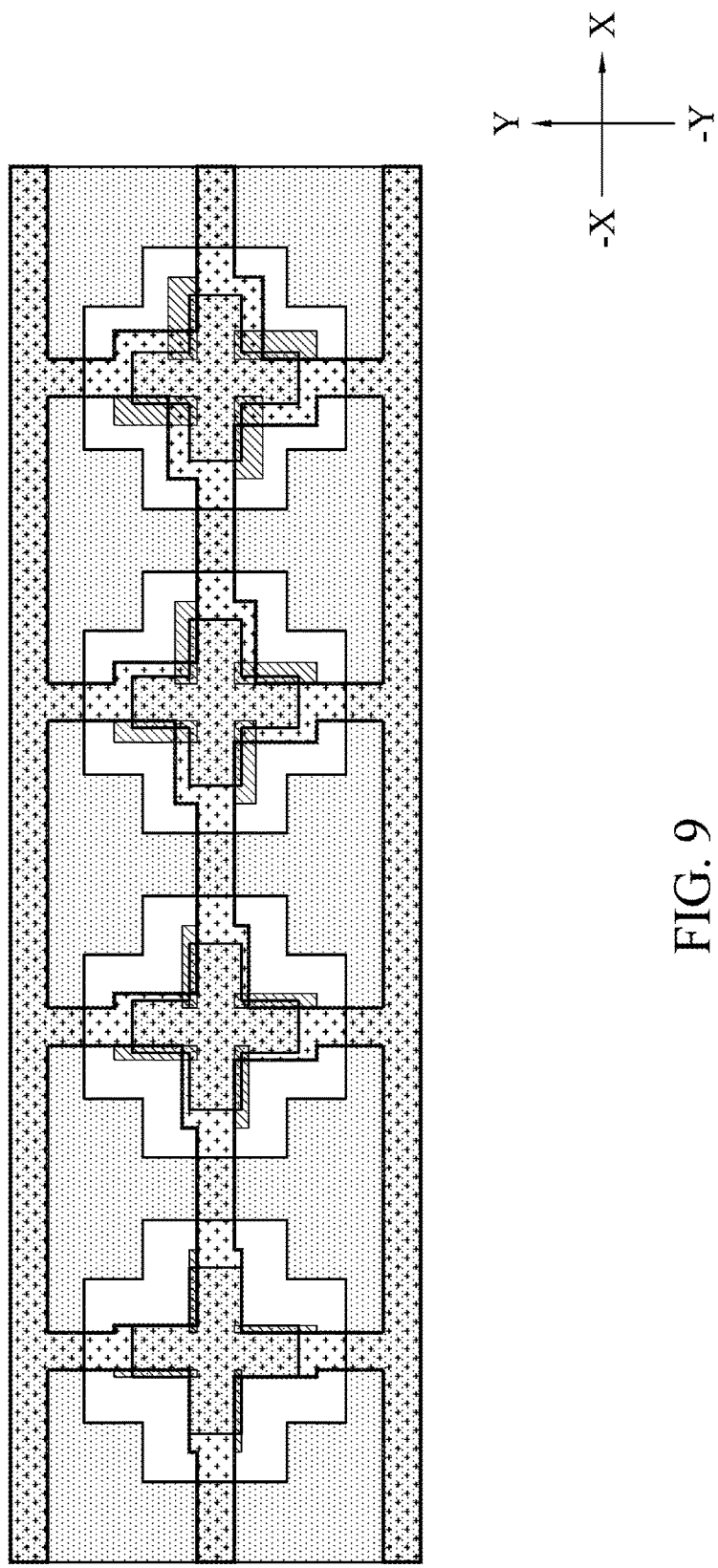
FIG. 9 is a schematic diagram illustrating a top view of the two substrates after being assembled in accordance with an embodiment.

FIG. 9 is a schematic diagram illustrating a top view of the two substrates after being assembled in accordance with an embodiment. The references of the alignment patterns are not shown in FIG. 9 for clarity. Referring to FIG. 4, FIG. 8, and FIG. 9, the openings 411, 412, 413 and 414 in the light shielding layer BM encompass the alignment patterns 810, 820, 830, and 840 respectively. The shift between the two substrate can be determined by observing which alignment pattern 810, 820, 830 and 840 is aligned to the corresponding one of the alignment patterns 420, 430, 440 and 450. To be specific, the shift of the upper substrate relative to the lower substrate toward −X direction is determined by observing whether the left edges of the first segments 811, 821, 831, and 841 are aligned with the left edge of the corresponding one of the third portions 423, 433, 443, and 453. The shift of the upper substrate relative to the lower substrate toward Y direction is determined by observing whether the top edges of the second segments 812, 822, 832, and 842 are aligned with the top edges of the corresponding one of the fourth portions 424, 434, 444, and 454. The shift of the upper substrate relative to the lower substrate toward X direction is determined by observing whether the right edges of the third segments 813, 823, 833, and 843 are aligned with the right edges of the corresponding one of the seventh portions 427, 437, 447, and 457. The shift of the upper substrate relative to the lower substrate toward −Y direction is determined by observing whether the bottom edges of the fourth segments 814, 824, 834, and 844 are aligned with the bottom edge of the corresponding one of the eighth portions 428, 438, 448, and 458.

Figure 10:
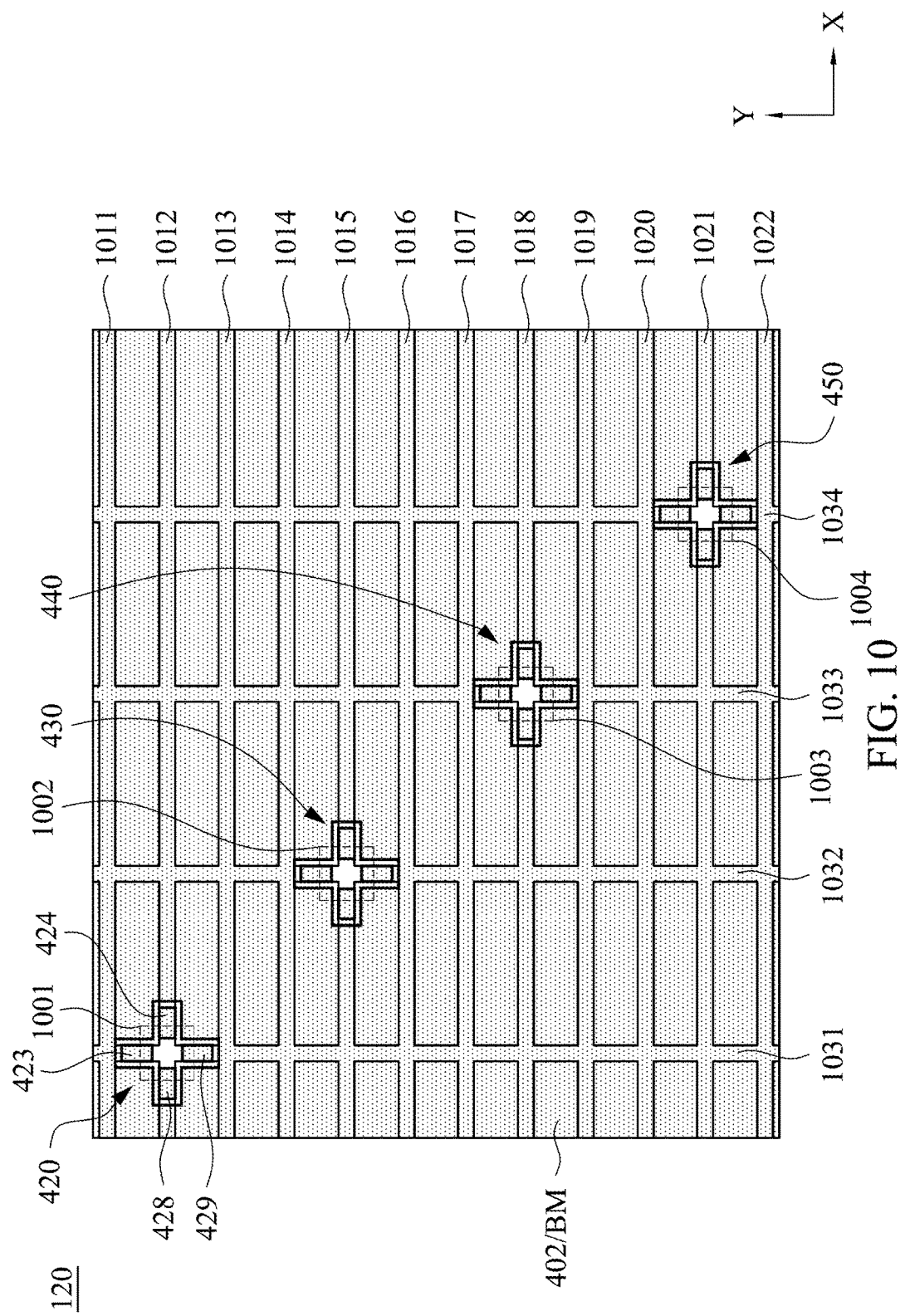
FIG. 10 is a schematic diagram illustrating disposition locations of the alignment patterns in the non-display area in accordance with an embodiment.

The four portions of the alignment patterns 420, 430, 440, and 440 are connected to each other in the embodiment of FIG. 4, but these four portions in one alignment pattern may be separated from each other (i.e. not connected) in other embodiments. To be specific, referring to FIG. 10, only the alignment patterns in the first metal layer and the light shielding layer are shown for clarity, but it should be appreciated that the alignment patterns in the second metal layer may be included in the embodiment of FIG. 10. In the embodiment of FIG. 10, the portions 423, 424, 427, and 428 of the alignment pattern 420 are not connected to each other, and there is a gap between each portion and the border portion 402. The alignment patterns 420, 430, 440, and 440 correspond to the alignment patterns 1001, 1002, 1003 and 1004 in the first metal layer respectively. The structures of the alignment patterns 1001, 1002, 1003, and 1004 are identical to that of the patterns 310, 320, 330, and 340 of FIG. 3 respectively, and each portion of the alignment patterns 1001, 1002, 1003 and 1004 is not shown in FIG. 10 for clarity. The first metal layer includes metal lines from 1011 to 1022 extending along X direction and metal lines 1031, 1032, 1033 and 1034 extending along Y direction. Some parts of the metal lines from 1011 to 1022 intersect with some parts of the metal lines 1031, 1032, 1033 and 1034. In particular, different ones of the alignment patterns 1001, 1002, 1003, 1004 in the first metal layer are located at the intersection of different horizontal metal line and different vertical metal line. For example, the alignment pattern 1001 is located at the intersection of the metal line 1012 and the metal line 1031; the alignment pattern 1002 is located at the intersection of the metal line 1015 and the metal line 1032, and so on. In other words, the alignment patterns in the first metal layer may be disposed in the same metal line (same as the embodiment of FIG. 3), and may also be disposed in different metal lines.

Figure 11:
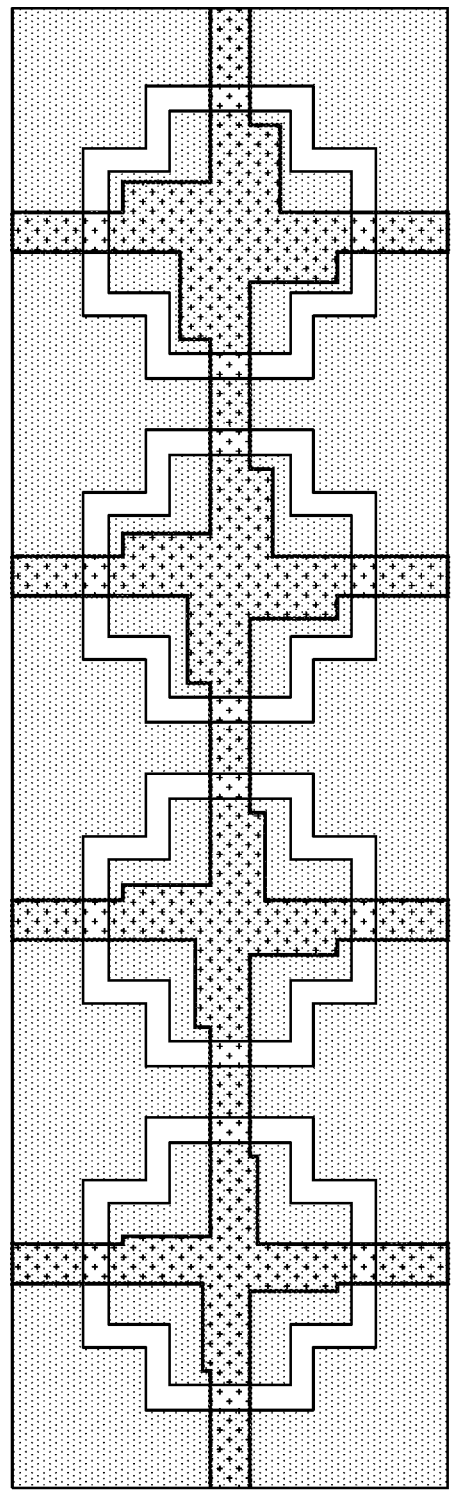
FIG. 11 is a schematic diagram illustrating a top view of the two substrates after being assembled in accordance with an embodiment.

It is noted that the shift between the two substrates can be determined as long as the portions/segments of the alignment patterns in any one layer gradually change along X direction or Y direction. For example, in some embodiments, the lengths of the alignment patterns in the first metal layer do not change along X direction and Y direction, but the alignment patterns in the light shielding layer gradually change along X direction and Y direction. People skilled in the technical field should be able to understand the embodiments described above, and modify these alignment patterns. For example, referring to FIG. 3, FIG. 4, and FIG. 11, the lengths of the alignment patterns in the light shielding layer BM are longer than that of the alignment patterns in the first metal layer along X direction and Y direction in the embodiment of FIG. 11. In detail, the length of the third portion 423 along X direction is longer than that of the first portion 311 along X direction; the length of the fourth portion 424 along Y direction is longer than that of the second portion 312 along Y direction; the length of the seventh portion 427 along X direction is longer than that of the fifth portion 315 along X direction; the length of the eighth portion 428 along Y direction is longer than that of the sixth portion 316 along Y direction. The same design may be applied to other alignment patterns, and it will not be repeated.

The metal layer in the specification may be a single layer of aluminum, copper, titanium, tungsten, etc. or a compound layer of molybdenum-aluminum-molybdenum, titanium-aluminum-titanium, titanium-copper-titanium, etc. which is not limited in the invention.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel having a display area and a non-display area, wherein the display panel comprises:
a first substrate, wherein a metal layer is disposed on the first substrate, the metal layer has a plurality of first alignment patterns in the non-display area, and each of the first alignment patterns comprises a first portion and a second portion; and
a second substrate, wherein a light shielding layer is disposed on the second substrate, the light shielding layer has a plurality of second alignment patterns in the non-display area, and each of the second alignment patterns comprises a third portion and a fourth portion,
wherein the second alignment patterns respectively correspond to the first alignment patterns, and the third portions respectively correspond to the first portions, and the fourth portions respectively correspond to the second portions,
wherein there is a first length difference between a length of each of the first portions along a first direction and a length of the corresponding third portion along the first direction, and at least two of the first length differences are different,
wherein there is a second length difference between a length of each of the second portions along a second direction and a length of the corresponding fourth portion along the second direction, and at least two of the second length differences are different,
wherein the light shielding layer has a plurality of openings in the non-display area, and one of the openings encompasses one of the first alignment patterns and one of the second alignment patterns.

2. The display panel of claim 1, wherein the first portions belong to a first metal line extending along the second direction, the second portions belong to a plurality of second metal lines extending along the first direction.

3. The display panel of claim 2, wherein the third portions extend toward the second direction, and the fourth portions extend toward the first direction.

4. The display panel of claim 1, wherein each of the first alignment patterns further comprises a fifth portion and a sixth portion, and the fifth portions extend toward the second direction, and the sixth portions extend toward the first direction.

5. The display panel of claim 4, wherein each of the second alignment patterns further comprises a seventh portion and an eighth portion, and the seventh portions extend toward the second direction, and the eighth portions extend toward the first direction.

6. The display panel of claim 5, wherein there is a third length difference between a length of each of the fifth portions along the first direction and a length of the corresponding seventh portion along the first direction, and at least two of the third length differences are different,
wherein there is a fourth length difference between a length of each of the sixth portions along the second direction and a length of the corresponding eighth portion along the second direction, and at least two of the fourth length differences are different.

7. The display panel of claim 1, wherein at least two of the first alignment patterns are electrically connected to each other.

8. The display panel of claim 1, wherein the light shielding layer comprises a border portion disposed in the non-display area, and there is a gap between each of the second alignment patterns and the border portion.

9. The display panel of claim 1, wherein the metal layer is a first metal layer, and a second metal layer is disposed on the first substrate, and the second metal layer comprises a plurality of third alignment patterns which are disposed in the non-display area and respectively correspond to the first alignment patterns.

10. The display panel of claim 9, wherein one of the third alignment patterns is partially overlapped with one of the first alignment patterns.

11. The display panel of claim 10, wherein each of the third alignment patterns comprises a first segment and a second segment, and the first segment extends toward the second direction, and the second segment extends toward the first direction.

12. The display panel of claim 11, wherein at least two lengths of the first segments along the first direction are different, and at least two lengths of the second segments along the second direction are different.

13. The display panel of claim 12, wherein one of the first segments is at least partially overlapped with one of the first portions, and one of the second segments is at least partially overlapped with one of the second portions.

14. The display panel of claim 13, wherein each of the third alignment patterns further comprises a third segment and a fourth segment, and the third segments extend toward a direction opposite to the second direction, and the fourth segments extend toward a direction opposite to the first direction.

15. The display panel of claim 1, wherein at least two lengths of the first portions along the first direction are different, and at least two lengths of the second portions along the second direction are different.

16. The display panel of claim 1, wherein at least two lengths of the third portions along the first direction are different, and at least two lengths of the fourth portions along the second direction are different.

17. The display panel of claim 1, wherein the metal layer comprises a plurality of first metal lines and a plurality of second metal lines, and at least part of the first metal lines is intersected with at least part of the second metal lines,
wherein different ones of the first alignment patterns are located at intersections of different ones of the first metal lines and different ones of the second metal lines.

18. The display panel of claim 1, wherein the third portion and the fourth portion of one of the second alignment patterns are connected to each other.

19. The display panel of claim 1, wherein there is a gap between the third portion and the fourth portion of one of the second alignment patterns.

20. The display panel of claim 1, wherein a length of the third portion of one of the second alignment patterns along the first direction is longer than a length of the first portion of the corresponding first alignment pattern along the first direction,
wherein a length of the fourth portion of one of the second alignment patterns along the second direction is longer than a length of the second portion of the corresponding first alignment pattern along the second portion.

* * * * *